United States Patent [19]

Sawada et al.

[11] Patent Number: 4,977,104
[45] Date of Patent: Dec. 11, 1990

[54] METHOD FOR PRODUCING A SEMICONDUCTOR DEVICE BY FILLING HOLLOWS WITH THERMALLY DECOMPOSED DOPED AND UNDOPED POLYSILICON

[75] Inventors: Kazuyuki Sawada, Moriguchi; Hisashi Ogawa, Katano; Kohsaku Yano, Osaka; Tsutomu Fujita, Hirakata, all of Japan

[73] Assignee: Matsushita Electric Industrial Co., Ltd., Osaka, Japan

[21] Appl. No.: 327,538

[22] Filed: Mar. 23, 1989

[30] Foreign Application Priority Data

Jun. 1, 1988 [JP] Japan .................. 63-134973

[51] Int. Cl.$^5$ .................. H01L 21/225; H01L 21/385
[52] U.S. Cl. ...................... 437/162; 437/60; 437/919
[58] Field of Search ............ 437/60, 162, 919

[56] References Cited

U.S. PATENT DOCUMENTS

| 4,249,968 | 2/1981 | Gardiner et al. | 437/162 |
| 4,507,849 | 4/1985 | Shinozaki | 437/162 |
| 4,604,150 | 8/1986 | Lin | 437/162 |
| 4,713,678 | 10/1987 | Womack et al. | 357/23.6 |
| 4,833,094 | 5/1989 | Kenney | 437/60 |

OTHER PUBLICATIONS

Buried Storage Electrode (BSE) Cell for Megabit Drams, Sakamoto et al, c. 1985, pp. 710-713.
A Three-Dimensional Dram Cell of Stacked Switching-Transistor in SOI (SSS), Ohkura et al, c. 1985, pp. 718-721.
A Trench Transistor Cross-Point Dram Cell, Richardson et al, c. 1985, pp. 714-717.
An Isolated-Merged Vertical Capacitor Cell for Large Capacity Dram, c. 1984, pp. 240-243.
Trench Coverage Characteristics of Polysilicon Deposited by Thermal Decomposition of Silane, 1984, pp. L482-L485.

Primary Examiner—Brian E. Hearn
Assistant Examiner—Laura M. Holtzman
Attorney, Agent, or Firm—Stevens, Davis, Miller & Mosher

[57] ABSTRACT

A method is provided for producing a semiconductor device characterized by filling hollows having a high aspect ratio with a semiconductor film doped with impurities as dopants and an undoped semiconductor film, given that the doped polycrystalline Si film produced by thermal decomposition of reactive gases mixed with impurity gases and the undoped polycrystalline Si film produced by thermal decomposition of reactive gases containing no impurity gas have different step coverage characteristics from each other. The method allows uniform distribution of dopants as well as improvement of processing throughput by forming sequentially the two types of semiconductor films in one reaction chamber.

2 Claims, 11 Drawing Sheets

8 PHOSPHORUS-DOPED POLY-Si FILM
4
2
9 VOID
1

4
2
1
8 PHOSPHORUS-DOPED POLY-Si FILM

UNDOPED POLY Si

P DOPED POLY Si

METHOD FOR PRODUCING A SEMICONDUCTOR DEVICE BY FILLING HOLLOWS WITH THERMALLY DECOMPOSED DOPED AND UNDOPED POLYSILICON

BACKGROUND OF THE INVENTION

1. Field of the Invention

The present invention relates to a method for producing a semiconductor device for use in electrodes of capacitors in storage devices which contributes to production of a higher degree of integration of so-called very large scale integration (VLSI) the method being effective in filling fine deep hollows with semiconductor films having a low resistivity.

2. Description of the Prior Art

A trench structure has been utilized for isolation of respective devices and capacitor devices in order to increase the degree of integration for large scale integration (LSI). In general, polycrystalline silicon films (referred to as poly-Si films hereinunder) produced by a low pressure CVD process have an excellent step covering capability or step coverage, so that they have been used in filling the trench structure. For electrodes of capacitor devices, however, the poly-Si films have been doped with impurities as dopants to reduce their resistivities because materials for the electrodes should have a low resistivity. An attempt has been made to achieve the deposition of poly-Si films doped with impurities by effecting the doping with dopants produced from $POCl_2$ through a thermal diffusion process, or a CVD process. The former process where the dopants produced by decomposition of $POCl_3$ are thermally diffused, comprises, as illustrated in FIG. 1(a) first depositing a poly-Si film 5 on Si substrate 1 having trench 3, on the walls of which $SiO_2$ film 2 has been formed as a capacitor oxide film, so as to fill the cavity of the trench with the poly-Si film, while levelling the top surface. Then poly-Si film 5 is doped with phosphorus from $POCl_3$ in a thermal diffusion furnace by thermally diffusing the phosphorus into the film, as shown in FIG. 1(b). This method, however, suffers from disadvantages in that when the trench has a significantly increased aspect ratio, uniform diffusion of phosphorus to the bottom of the trench is not achieved at usual concentrations of the phosphorus resulting in non-uniform distribution thereof, although uniform diffusion of phosphorus may be realized at higher concentrations. Therefore, the method is unsuitable in densely integrated devices. An alternative attempt at doping uniformly in the trench having a high aspect ratio may be illustrated with reference to FIG. 2. As seen from FIG. 2(a), the first poly-Si film 6 is deposited to a lower thickness (about 0.1 $\mu$m) on Si substrate 1 having trench 3, on the surface of which $SiO_2$ film 2 has been formed as capacitor oxide film. Then, as shown in FIG. 2(b), phosphorus produced by thermal decomposition of $POCl_3$ is thermally diffused throughout the first poly-Si film 6 in a thermal diffusion furnace and thereafter a phosphorus glass layer formed on the surface of the poly-Si film during the process is removed. Then, as shown in FIG. 2(c), the second poly-Si film 7 is deposited to a higher thickness (about 2 $\mu$m) so as to fill trench 3 while levelling the top of the substrate. After annealing, the poly-Si films on the upper surface of the substrate are etched to remove the first and the second poly-Si films 6 and 7 leaving only parts thereof which are contained in the trench by allowing $SiO_2$ films 4 to function as a stopper on etching, as shown in FIG. 2(d). During the heat-treating step as described above, phosphorus diffuses from poly-Si film 6 to poly-Si film 7 resulting in the formation of a low resistivity electrode. A problem in this method, however, is the complexity of the process. That is, the first poly-Si film 6 is deposited to a low thickness and doped with phosphorus through the thermal diffusion of phosphorus produced by decomposition of $POCl_3$, and then the second poly-Si film 7 is deposited. Thus, the process is complicated.

On the other hand, as shown in FIG. 3(a) the latter method, where the doping with impurities as dopants is effected by a CVD process, suffers from the fact that poly-Si film 8 deposited with dopants by the CVD process exhibits a poor step coverage and voids 9 are formed during the step of filling the trench with the film as generally described by T. Morie and J. Murota in Jpn. J. Appl. Phys., Vol. 23, No. 7, 1984 pp. L482–L484. This fact causes the ingress of reaction gases into the voids 9 in the subsequent step of etching poly-Si film 8 so that the parts of poly-Si film 8 which are inside the trench are also etched as shown in FIG. 3(b). This problem becomes more significant, as the extent of integration is increased and the trench has dimensions narrower in width and greater in depth.

SUMMARY OF THE INVENTION

It is an object of the present invention to provide a method for producing a semiconductor device which can be efficiently produced in mass production and allows the very high integration of devices, said method being capable of producing easily low resistivity semiconductor films in fine hollows having a high aspect ratio without forming voids therein.

In order to achieve the above object, the method for producing a semiconductor device in accordance with the present invention comprises a first step of depositing the first semiconductor films containing dopants by thermally decomposing reactive gas incoporated with at least one gases for dopants selected from a group consisting of $PH_3$, $B_2H_6$ and $AsH_3$ on the semiconductor substrate having fine hollows, a second step of depositing the second undoped semiconductor films on the parts of said first semiconductor films which are inside the hollows by the thermal decomposition of the reactive gases not containing the gases for dopants, and a heat-treating step of diffusing the dopants from said first semiconductor films to said second semiconductor films. Of course, the order of depositing the first and second films can be reversed in the present invention.

The present invention achieves the following effects due to the construction as described above:

The combination of the first doped semiconductor films which are produced by the thermal decomposition of the reactive gases mixed with impurity gases for dopants and the second undoped semiconductor films having a higher step covering capability which are produced by the thermal decomposition of the reactive gases containing no impurity gas allows the fine hollows having a high aspect ratio to be filled with the low resistivity semiconductor films without forming voids in the filling films within the hollows and in addition, constitutes a simplified filling process.

Moreover, since the fine hollows can be filled without forming any voids, one can eliminate a difficulty wherein the parts of the first and the second semiconductor films inside the hollows become etched out due to the introduction of etching gases into the otherwise formed voids during the step of etching the first and the second semiconductor films, which step is intended to leave only the semiconductor films inside the hollows.

DESCRIPTION OF PREFERRED EMBODIMENTS

EXAMPLE 1

Figure 1A:
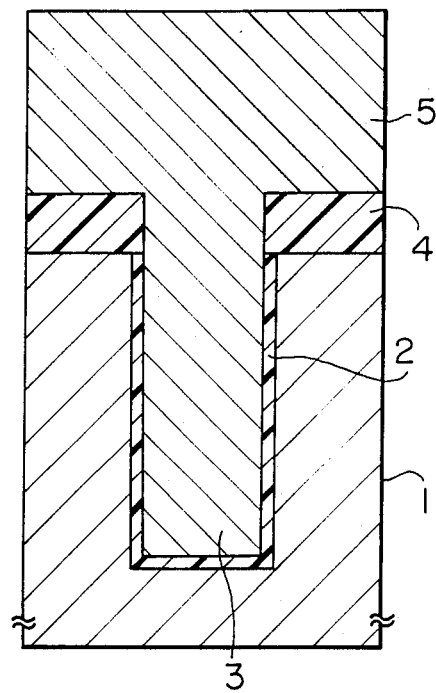
FIGS. 1(a) and 1(b) are schematic cross sectional views of the substrate and films formed thereon at a selected step in accordance with the prior art for producing semiconductor devices.
Figure 1B:
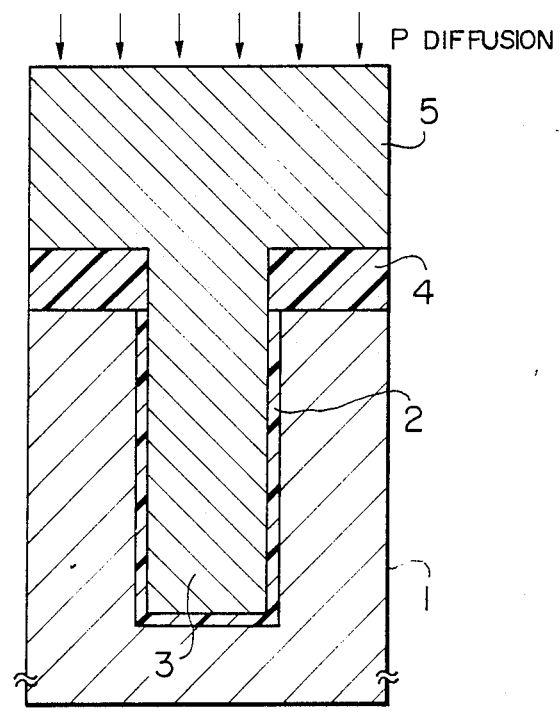
Figure 2A:
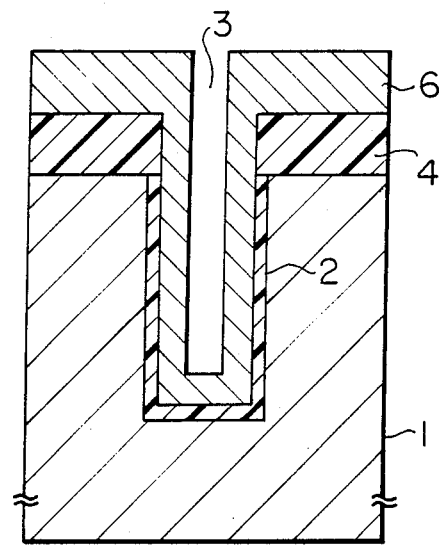
FIGS. 2(a) through 2(d) are schematic cross sectional views of the substrate and films formed thereon at a selected step in accordance with the prior art for producing semiconductor devices.
Figure 2B:
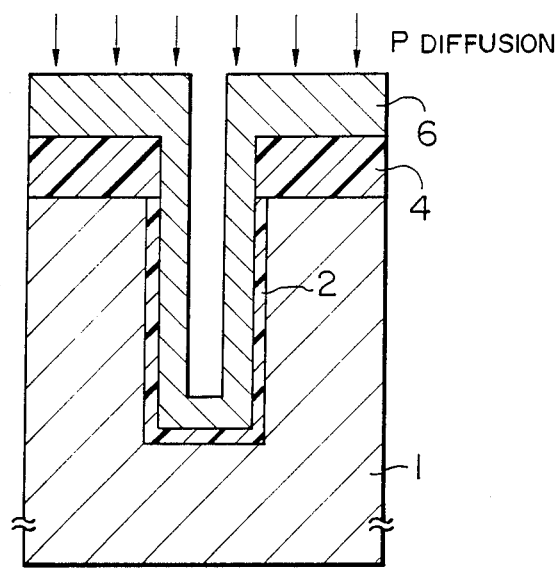
Figure 2C:
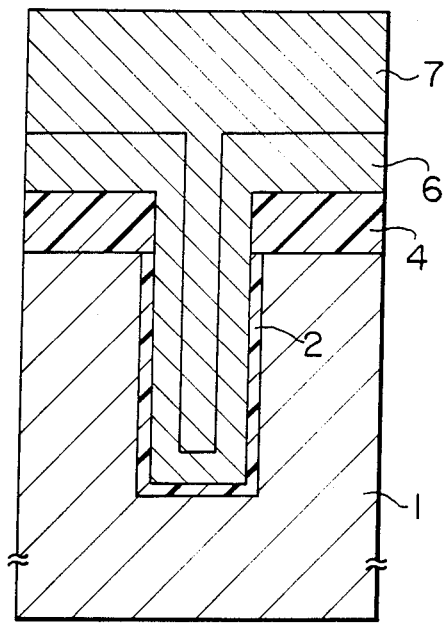
Figure 2D:
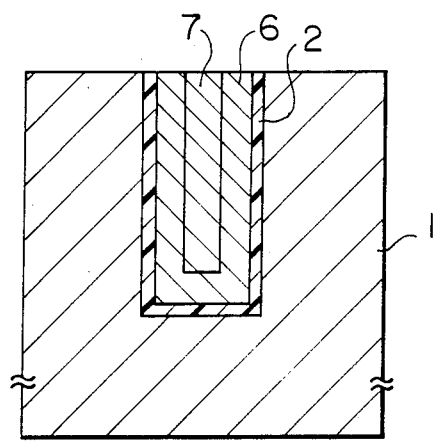
Figure 3A:
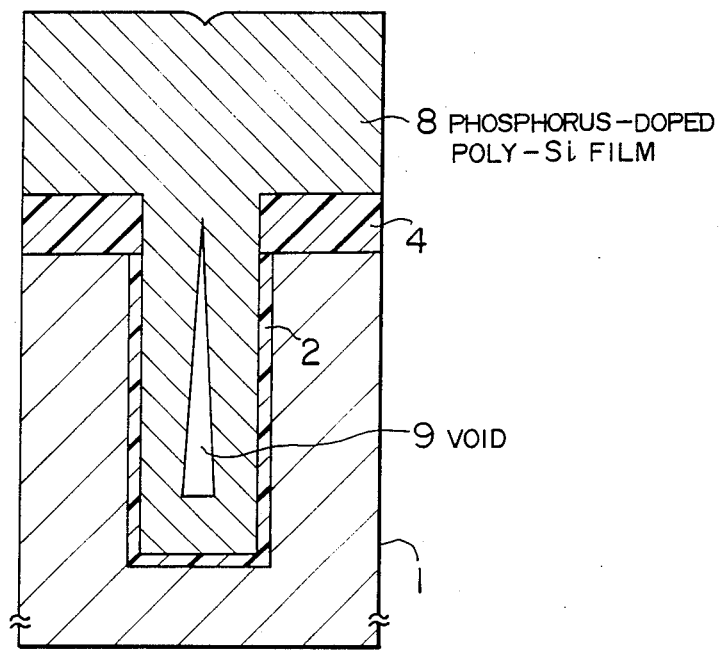
FIGS. 3(a) and 3(b) are schematic cross sectional views of the substrate and films formed thereon at a selected step in accordance with the prior art for producing semiconductor devices.
Figure 3B:
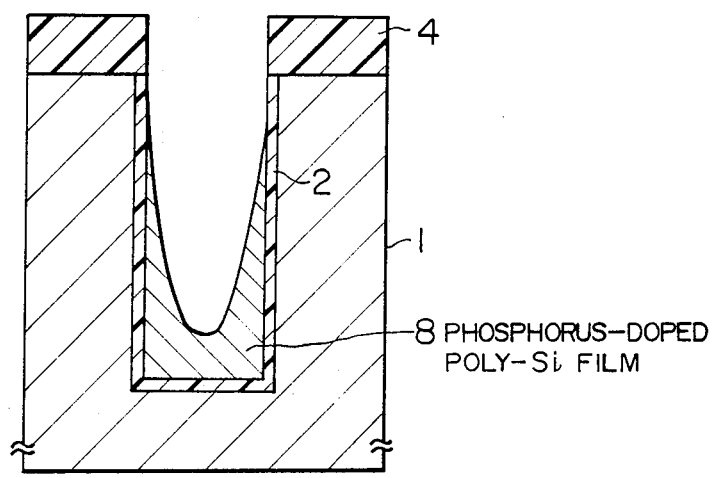
Figure 4A:
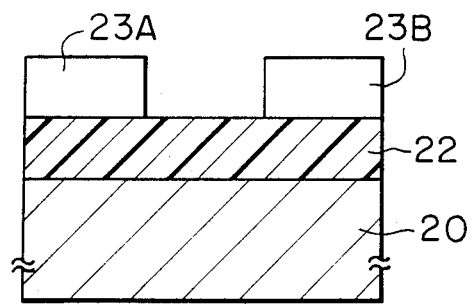
FIGS. 4(a) through 4(g) are schematic cross sectional views of the substrate and films formed thereon at a selected step in accordance with the present method for producing semiconductor devices.
Figure 4B:
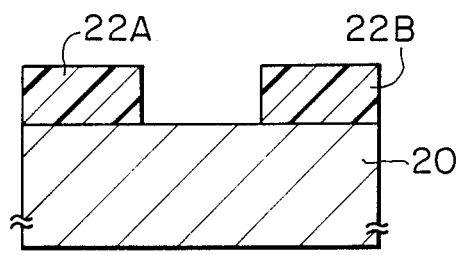
Figure 4C:
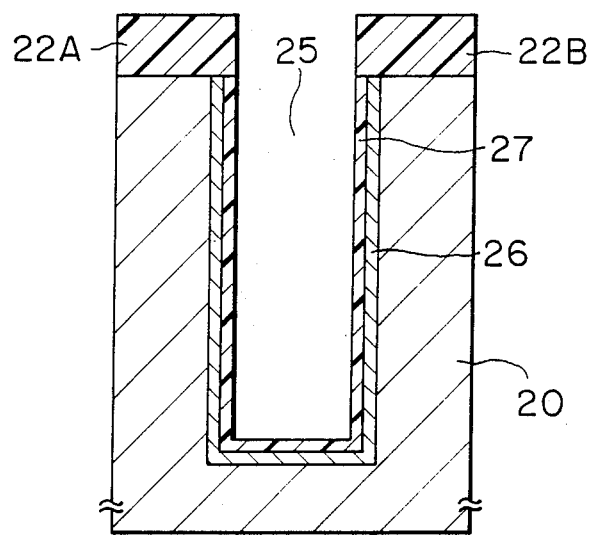
Figure 4D:
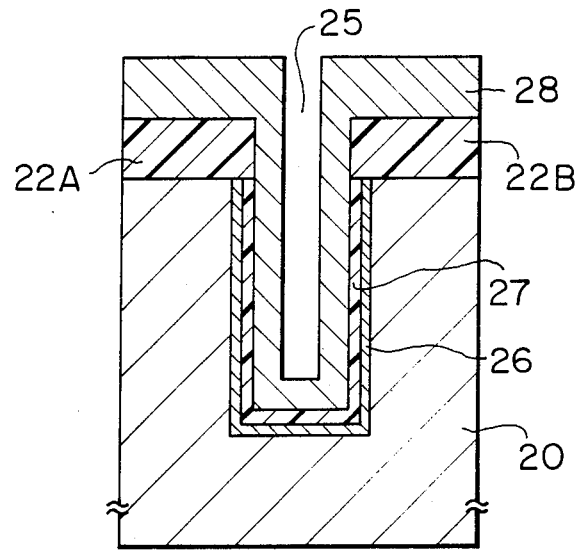
Figure 4E:
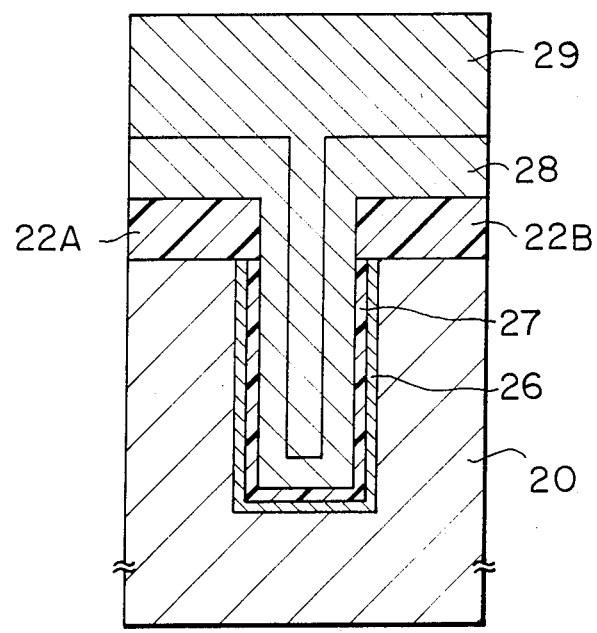

FIGS. 4(a) through 4(g) are schematic cross sectional views of the substrate and films formed thereon at a selected step in accordance with an embodiment of the present method for producing a semiconductor device. Referring to FIG. 4, Example 1 of the present invention demonstrates a method for producing a buried electrode for a capacitor having a trench type structure by filling the trench with a poly-Si film doped with phosphorus. Si semiconductor substrate 20 is provided on its surface with $SiO_2$ film 22, to which a resist film is applied and exposed to the light in desired areas to produce a pattern of resist 23 (23A, 23B) as shown in FIG. 4(a). Then the substrate is placed in a dry etching apparatus and a plasma is generated in a gaseous mixture of $CHF_3$ and $O_2$ under a pressure of 0.1 torr. Parts of $SiO_2$ film 22 which are not masked with the pattern of resist film 23 (23A, 23B) are etched and then the pattern of resist film 23 (23A, 23B) is removed to produce a pattern of $SiO_2$ film 22 (22A, 22B), as shown in FIG. 4(b). Thereafter, the substrate is placed in the dry etching chamber and a plasma is generated in a gaseous mixture of $SiCl_4$, $SF_5$, $CH_2F_2$ and $O_2$ under a pressure of 1 torr to etch Si substrate 20 by using the pattern of $SiO_2$ film 22 (22A, 22B) as a mask whereby a trench 25 having a high aspect ratio of 0.5 μm in width and 3 μm in depth is formed as shown in FIG. 4(c). The substrate is then placed in an ion implantation apparatus and implanted with As ions. The substrate is then oxidized in a thermal oxidation furnace to produce $n^4$ diffused layer 26 and $SiO_2$ film 27 acting as capacitor oxide film as shown in FIG. 4(c). Thereafter, the substrate shown in FIG. 4(c) is placed in a reaction chamber of a CVD apparatus and maintained at a temperature of 600° C. under a reduced pressure. A gaseous mixture of $SiH_4$ and $PH_3$ is introduced in the apparatus at a flow ratio of $SiH_4$ to $PH_3$ of 400:1. While the pressure is maintained at 1 torr, the gaseous mixture containing $SiH_4$ is thermally decomposed to deposit poly-Si film doped with phosphorus 28 up to a thickness of 0.1 μm as shown in FIG. 4(d). Thereafter, the substrate from FIG. 4(d) is placed in a reaction chamber of the CVD apparatus at room temperature, heated to a temperature of 600° C. under a reduced pressure and maintained at that temperature. Keeping the pressure at 0.4 torr, $SiH_4$ is thermally decomposed to deposit undoped poly-Si film 29 up to a thickness of 2 μm so that trench 25 is filled with the film while levelling the top surface of the substrate as shown in FIG. 4(e). In this process, elevating the temperature after the substrate has been placed in the reaction chamber prevents any oxide films from being produced at the interface of phosphorus-doped poly-Si film 28 and undoped poly-Si film 29. In addition, since undoped poly-Si film 29 has a higher step-covering capability, trenches of any sizes can be filled with film 29, even having an aspect ratio of 10 or less, without forming any voids by optimizing the thickness of phosphorusdoped poly-Si film 28. For example, a trench of 0.5 μm in width and 3 μm in depth can be filled without any voids. Moreover, phosphorus-doped poly-Si film 28 may be deposited at a deposition rate of about 4 nm/min, while undoped poly-Si film 29 as high as about 10 nm/min, so that undoped poly-Si film may be utilized to improve processing throughput.

Figure 4F:
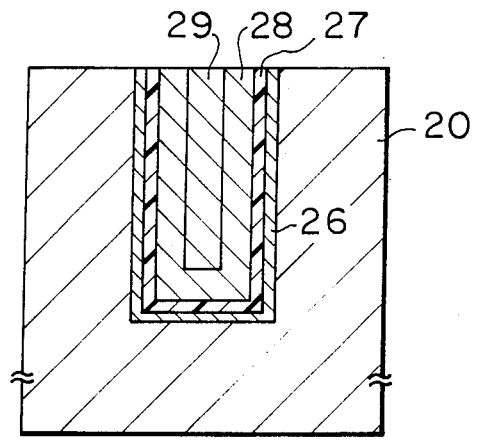

Then the substrate is kept at a temperature of 900° C. in an atmosphere of $N_2$ and subjected to heat-treatment for 30 minutes in order to diffuse phosphorus from poly-Si film 28 to poly-Si film 29 resulting in uniform distribution of phosphorus throughout the films inside the trench. Thereafter, the substrate as shown in FIG. 4(e) is placed in a dry etching chamber and a plasma is generated in a gaseous mixture of $SF_6$ and $C_2ClF_5$ under a pressure of 0.15 torr to etch poly-Si films 28 and 29 leaving parts of poly-Si films 28 and 29 which are inside the trench. Then $SiO_2$ film 22 (22A, 22B) as a etching stopper is removed to produce a buried electrode in the structure of the trench type capacitor as shown in FIG. 4(f). During this process, the void-free filling in the trench with poly-Si films 28 and 29 contributes to preventing the poly-Si films 28 and 29 inside the trench from being etched out due to introduction of etching gases.

As a modification of the above, the procedure discussed in the above Example may be repeated except that the deposition sequence of phosphorus-doped poly-Si film 28 and undoped poly-Si film 29 is reversed, i.e., the undoped poly-Si film 29 exhibiting a good step coverage is first deposited to a thin thickness in the trench and then the phosphorus-doped poly-Si film 28 is deposited in the remaining space of about 0.2 μm or less, resulting in the similar results.

Figure 4G:
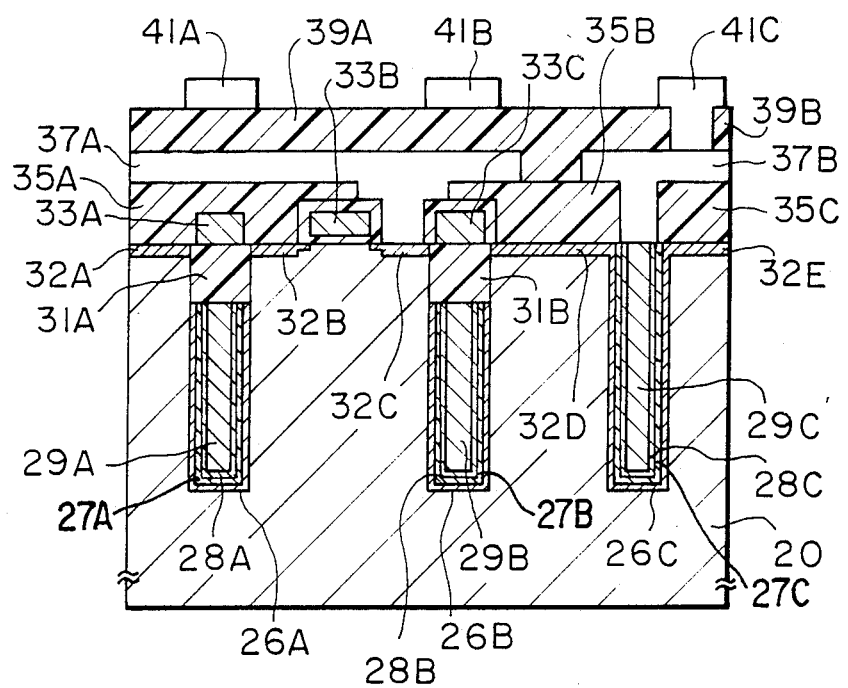

Then $SiO_2$ films 31 (31A, 31B) function as insulating spacer films; $n^+$ diffused layers 32 (32A~32E); poly-Si films 33 (33A~33C) as gate electrodes; $SiO_2$ films 35 (35A~35C) and 39 (39A, 39B) as inter-layer insulators; Al films 37 (37A, 37B) and 41 (41A~41C) are sequentially formed to produce a memory device as shown in FIG. 4(g).

Although $PH_3$ is used as an impurity in the low pressure CVD process in the Example described above, the use of $AsH_3$, $B_2H_6$ and the like also results in similar effects. The trench may be filled with semiconductor films such as single crystal Si and the like to obtain the same effects as with poly-Si films. Moreover, even when the configuration of the capacitor is a hole rather than trench, one can achieve the same effects. Although the low pressure CVD process is used as a process for depositing poly-Si films 28 and 29 in Example described above, plasma CVD or photo-CVD processes may be employed as well. The oxide film used as capacitor insulating film may be replaced by insulating films such as nitrides as another embodiment of this Example in accordance with the present invention.

EXAMPLE 2

Figure 5:
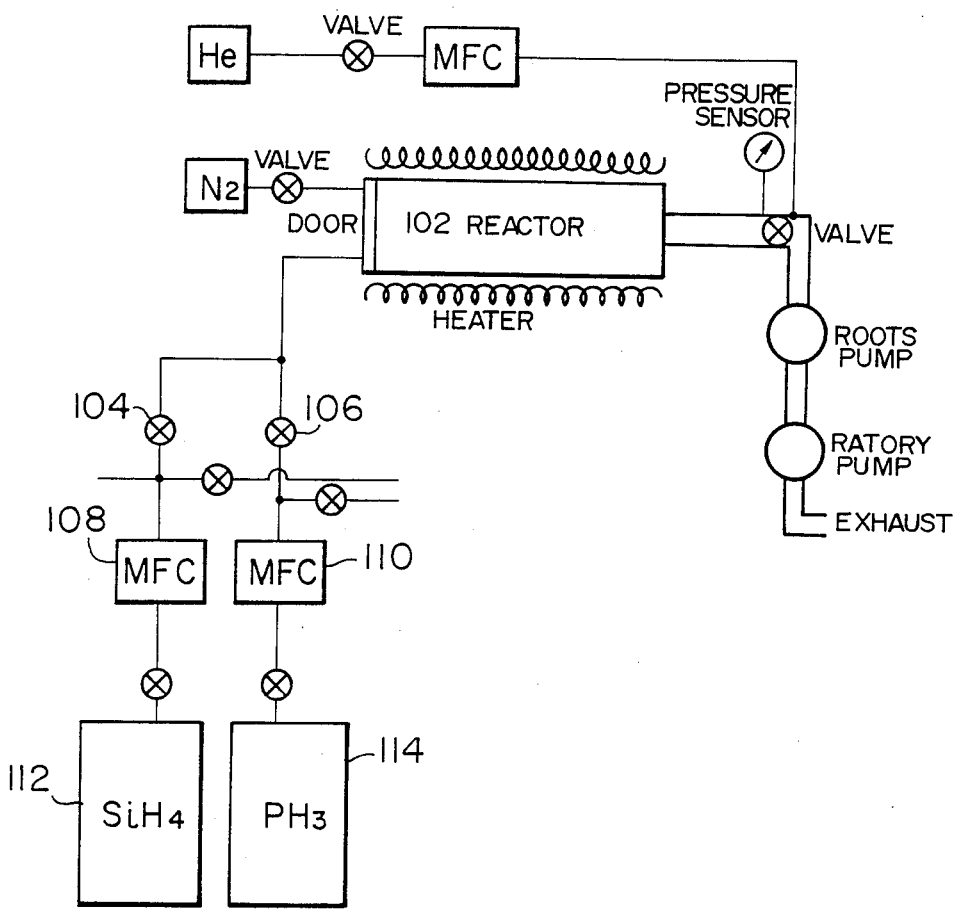
FIG. 5 shows a schematic arrangement of one of the CVD systems to be used in the present method for producing semiconductor devices.

The substrate as shown in FIG. 4(c) is placed in a reaction chamber 102 of a CVD apparatus as shown in FIG. 5 and maintained at a temperature of 600° C. under a reduced pressure. Valves 104 and 106 are opened and a gaseous mixture of $SiH_4$ 112 as a reactive gas and $PH_3$ 114 as a doping gas is introduced in the reaction chamber at a flow ratio of $SiH_4$ to $PH_3$ of 400:1 by controlling the flow rates with mass flow controllers 108 and 110. While the pressure is maintained at 1 torr, the thermal decomposition reaction of $SiH_4$ 112 causes deposition of poly-Si film doped with phosphorus 28 from the decomposition of $PH_3$ to a thickness of 0.1 μm as shown in FIG. 4(d). Thereafter, while the substrate shown in FIG. 4(d) remains in the reaction chamber 102, valve 106 is closed and only $SiH_4$ gas 112 is introduced in the reaction chamber. While the substrate is at a temperature of 600° C. under a constant pressure of 0.4 torr, the thermal decomposition reaction of $SiH_4$ causes deposition of undoped poly-Si film 29 to a thickness of 2 μm so that the inside of trench 25 is filled therewith while levelling the top surface of the substrate as shown in FIG. 4(e). In this way, the sequential depositions of phosphorus-doped poly-Si film 28 and undoped poly-Si film 29 without removing the substrate out of reaction chamber 102 eliminates the formation of native oxide films at the interface of poly-Si films 28 and 29, e.g., to a thickness of about several nm. Moreover, since the depositions of two types of films can be performed without removing the substrate out of the reaction chamber, the processing throughput is improved. Thus the time requisite for the depositions of those films is reduced to about 5 hours.

Then the substrate as shown in FIG. 4(e) is kept at a temperature of 900° C. in an atmosphere of $N_2$ and subjected to heat-treatment for 30 minutes. In this case, because no oxide films acting as barriers for dopants to diffuse are produced at the interface of poly-Si films 28 and 29, phosphorus diffuses from poly-Si film 28 into poly-Si film 29 resulting in uniform distribution of phosphorus throughout the films inside the trench 25. Thereafter, the substrate is placed in a dry etching chamber and a plasma is generated in a gaseous mixture of $SF_8$ and $C_2ClF_5$ under a reduced pressure of 0.15 torr to etch poly-Si films 28 and 29 leaving parts of poly-Si films 28 and 29 which are inside the trench 25 as shown in FIG. 4(f). Next, $SiO_2$ films 22 (22A~22B) acting as etching stoppers are removed to produce a buried electrode in the structure of the trench type capacitor as shown in FIG. 4(f).

Then $SiO_2$ films 31 (31A, 31B) function as insulating spacer films; $n^+$ diffused layers 32 (32A~32E); poly-Si films 33 (33A~33C) as gate electrodes; $SiO_2$ films 35 (35A~35C) and 39 (39A, 39B) as inter-layer insulator films; Al films 37 (37A, 37B) and 41 (41A~41C) are sequentially formed to produce a memory device as shown in FIG. 4(g).

Figure 6A:
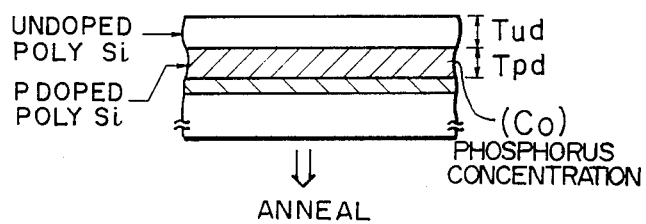
FIGS. 6(a) and 6(b) are schematic cross sectional views of a sample of the semiconductor film from Example 2 in accordance with the present invention illustrating the distribution of impurities in the sample.
Figure 6B:
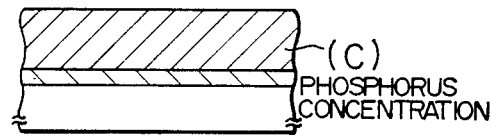
Figure 7A:
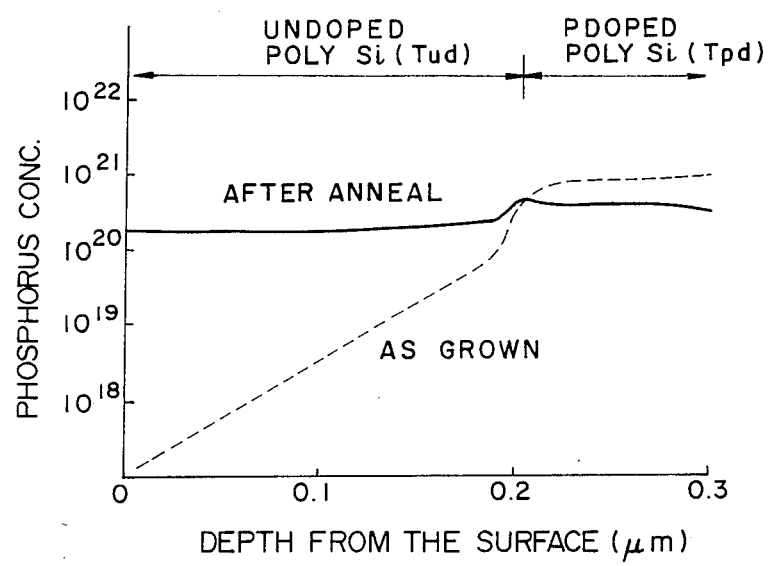
FIGS. 7(a) and 7(b) are graphs illustrating the concentration of an impurity in the semiconductor film from Example 2 in accordance with the present invention as a function of the depth from the surface.
Figure 7B:
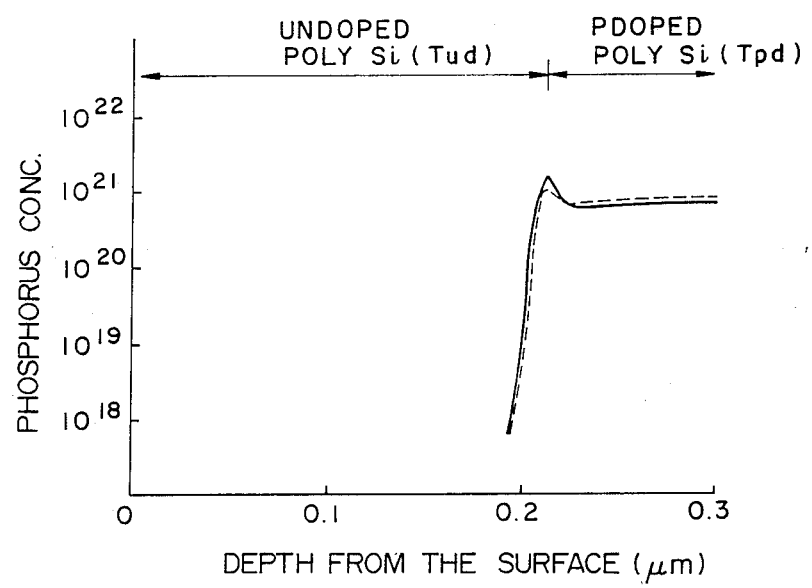
Figure 8A:
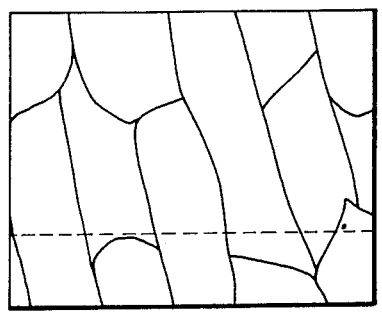
FIGS. 8(a) and 8(b) are schematic cross sectional views of the semiconductor film from Example 2 in accordance with the present invention illustrating the grain structure of the films.
Figure 8B:
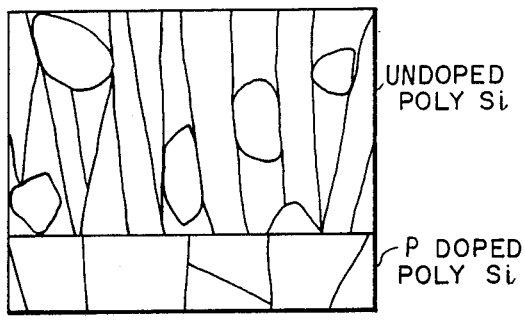
Figure 9:
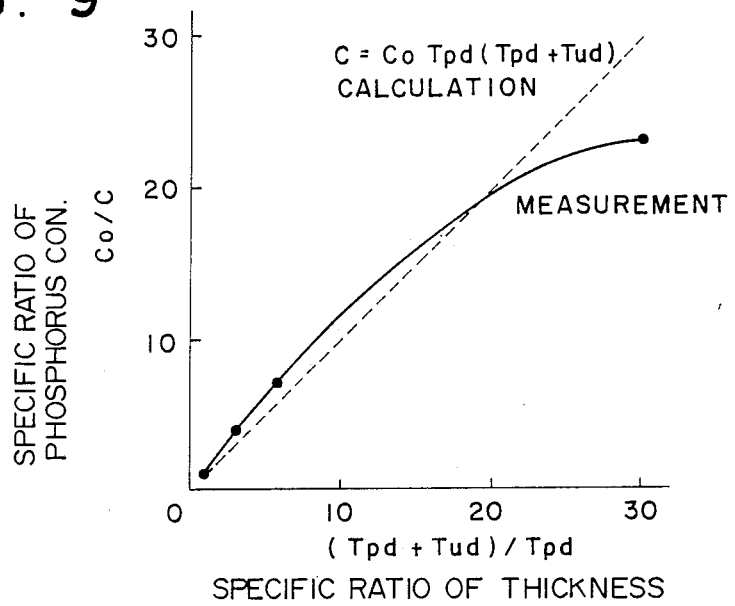
FIG. 9 is a graph illustrating the specific concentration of an impurity in the semiconductor film from Example 2 in accordance with the present invention as a function of the specific thickness of the film as providing a guidance of controlling the concentration of impurities.

By the procedure as described in Example 2 above, a phosphorus-doped poly-Si film of 0.1 μm thick and undoped poly-Si film of 0.2 μm are sequentially deposited to produce a sample having a structure as shown in FIG. 6 [FIG. 6(a) shows a schematic cross sectional view of the sample before heat-treatment, while FIG. 6(b) after heat-treatment.]. With the sample, profiles of phosphorus concentration in the direction of depth before and after heat-treatment is determined by means of secondary ion mass spectroscopy. The results obtained are shown in FIG. 7(a). FIG. 7(b) illustrates the case where oxide films are formed at the interface of the phosphorus-doped poly-Si film and the undoped poly-Si film. In FIGS. 7(a) and 7(b), the dotted line represents the profile before heat-treatment, while the solid one after heattreatment. As is apparent from those figures, when there is any native oxide film formed at the interface of phosphorus-doped poly-Si film and undoped poly-Si film, the heat-treatment can not cause the diffusion of phosphorus into the undoped poly-Si film, whereas when the sequential deposition is effected as in Example 2 above, the heat-treatment is efficient to achieve the uniform diffusion of phosphorus from the phosphorus-doped poly-Si film to undoped poly-Si film. Moreover, the sample after heat-treatment has a uniform grain structure as shown in FIG. 8(a) when the films are sequentially deposited as in Example 2 above, whereas a native oxide film is formed at the interface, a difference in the concentration of phosphorus between the doped film and the undoped film causes a difference in grain size resulting in the distinct two layer structure as shown in FIG. 8(b). Conseqently, as seen from Example 2 described above, two types of poly-Si films initially formed are converted into one uniform film after heat-treatment to provide equivalently a single layer film. In addition, the process for forming the films is very simple. Furthermore, as shown in FIG. 9 the concentration of phosphorus in the phosphorus-doped poly-Si film and the undoped poly-Si film after heat-treatment (C) can be easily calculated from a ratio of the thickness of the phosphorus-doped poly-Si film ($T_{pd}$) to that of the undoped poly-Si film ($T_{ud}$) and the concentration of phosporus in the phosphorus-doped poly-Si film before heat-treatment (Co), allowing the concentration of dopants in the electrodes to be optionally designed. The trench type electrodes of 0.5 μm wide formed by the procedure in this Example has a concentration of phosphorus of $1 \times 10^{20} cm^{-3}$.

EXAMPLE 3

Figure 10:
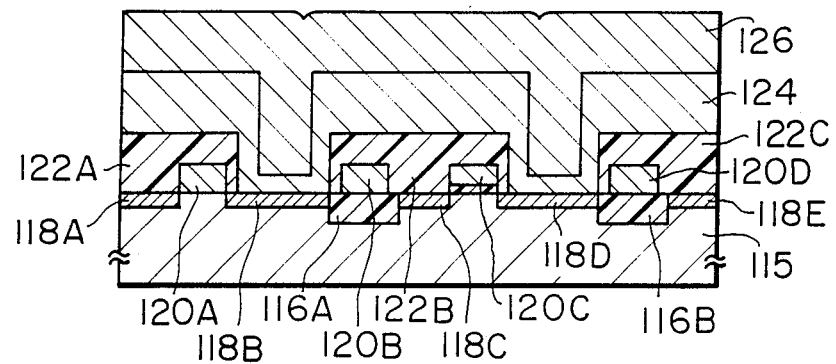
FIGS. 10(a) through 10(e) are schematic cross sectional views of the substrate and films formed thereon at a selected step in accordance with the present method for producing semiconductor device as described in Example 3 in accordance with the present invention.

Referring to FIG. 10, illustrating Example 3 in accordance with the present invention, a method for producing electrodes for use in stack type capacitors which may be utilized to achieve a higher extent of integration is demonstrated.

Figure 10B:
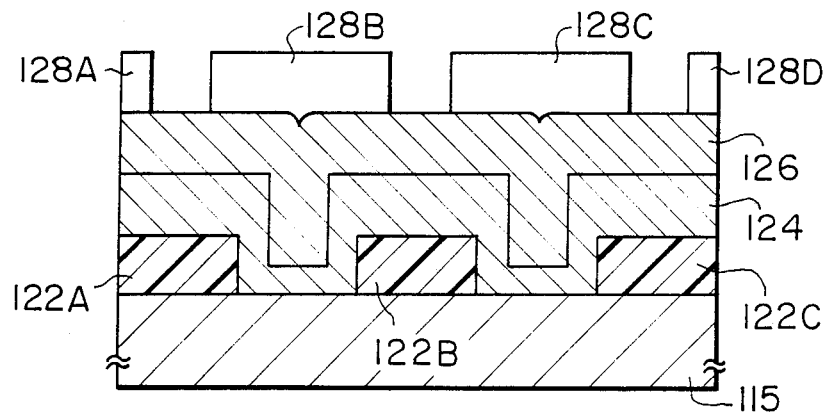
Figure 10C:
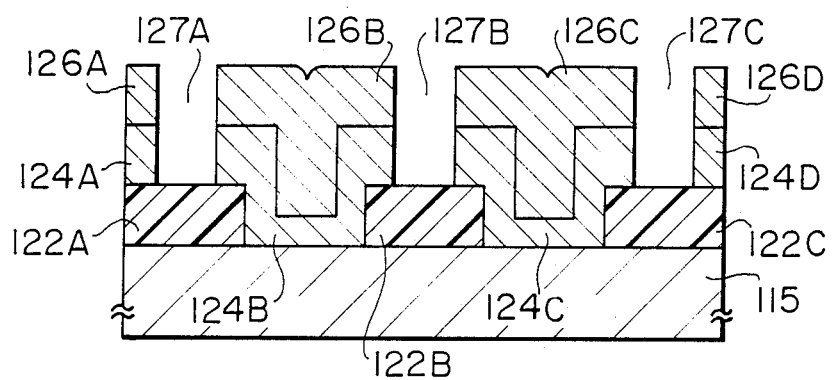
Figure 10D:
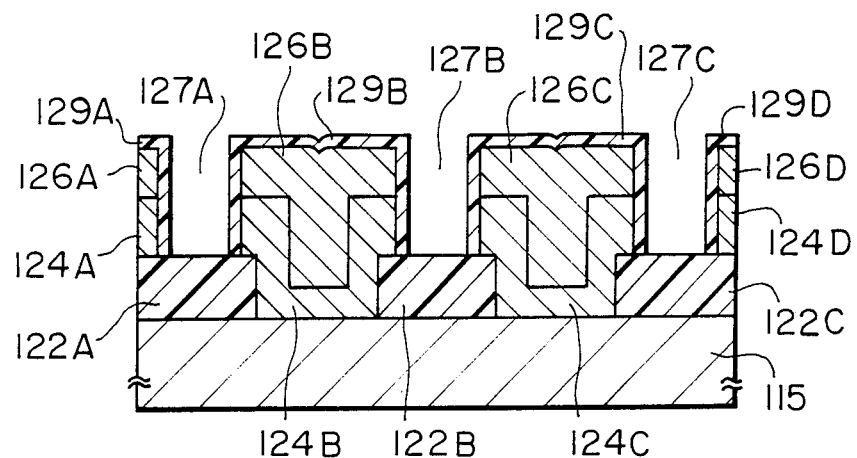
Figure 10E:
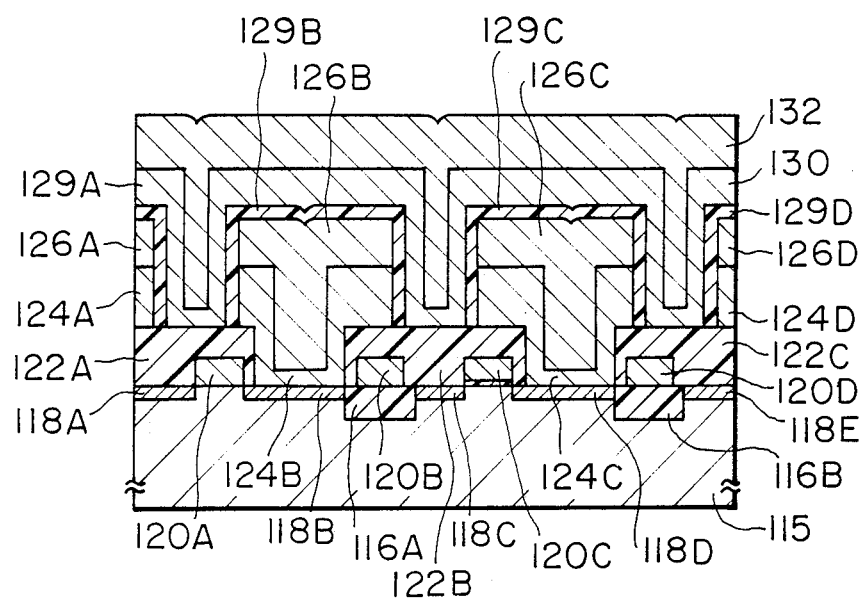

$SiO_2$ films 116 (116A, 116B) function as insulating spacer films, n+ diffused layer 118 (118A~118E), poly-Si films 120 (120A~120D) as gate electrodes (all the aforementioned films will not be shown in drawings hereinunder) and $SiO_2$ films 122 (122A~122C) as interlayer insulator films are formed on the substrate. By using the low pressure CVD process as in Example 2, phosphorus-doped poly-Si films 124 and undoped poly-Si films 126 are sequentially deposited on the substrate to 0.3 μm and 0.4 μm in thickness respectively as shown in FIG. 10(a). Then the substrate as shown in FIG. 10(a) is kept at a temperature of 900° C. in an atmosphere of $N_2$ and subjected to heat-treatment for 30 minutes. Next, a resist film is applied to the substrate and exposed to the light in desired areas to produce a pattern of resist 128 (128A~128D) as shown in FIG. 10(b). The substrate is then placed in a dry etching apparatus and a plasma is generated in a gaseous mixture of $SF_8$ and $C_2ClF_5$ under a pressure of 0.15 torr. Poly-Si films 124 and 126 are etched with the pattern of resist films 128 (128A~128D) being used as masks to produce a hole of 0.5 μm in width and 0.7 μm in depth as shown in FIG. 10(c) and, thereafter, the pattern of resist film 128 (128A~128D) is removed. Next, the substrate is oxidized in a thermally oxidizing furnace to form $SiO_2$ films 129 (129A~129D) as capacitor oxide films as shown in FIG. 10(d). Thereafter, by using the low pressure CVD process as in Example 2, phosphorus-doped poly-Si films 130 and undoped poly-Si films 132 are sequentially deposited to 0.1 μm and 0.4 μm in thickness resulting in filled holes 127 (127A~127C) whereby a memory device having a structure of a stack-type capacitor is obtained.

Although this Example has illustrated a process for producing phosphorus-doped poly-Si films 124 and undoped poly-Si films 126 as well as phosphorus-doped poly-Si films 130 and undoped poly-Si films 130 on the basis of the process used in Example 2, the use of the process as in Example 1 for producing phosphorus-doped poly-Si films and undoped poly-Si films leads to the identical results.

As described above, the method for producing semiconductor devices in accordance with the present invention achieves the following effects:

The sequential deposition of poly-Si films doped with dopants and undoped poly-Si films exhibiting a good step coverage by the CVD process can achieve void free filling of high aspect ratio hollows with low resistivity poly-Si films as well as uniform distribution of dopants. In addition, since the step for implantation can be simplified, it is possible to improve throughout significantly.

Moreover, the void-free filling of the insides of hollows with poly-Si films eliminates the possibility of removal of parts of poly-Si films inside the hollows due to introduction of etching gases into the voids, which may be otherwise formed, when the poly-Si films are etched to leave the parts thereof only inside the hollows.

Therefore, the present invention contributes greatly to the very high integration of devices as well as improvement of mass production by achieving the void-free filling of hollows having a high aspect ratio with low resistivity semiconductor films through a very simple process.

We claim:

1. A method for producing a semiconductor device comprising:
    a first step of depositing a first semiconductor film doped with impurities as dopants by thermally decomposing reactive gases incorporated with at least one gas for dopants selected from a group consisting of $PH_3$, $B_2H_6$ and $AsH_3$ on a semiconductor substrate having hollows in a reaction chamber;
    a second step of depositing a second undoped semiconductor film on said first semiconductor film to fill said hollows by thermal decomposition of said reactive gases not containing said gas for dopants without removing said semiconductor substrate out of said reaction chamber after said first step of deposition; and
    a heat-treating step of diffusing dopants from said first semiconductor film to said second semiconductor film in said hollows.

2. The method of claim 1 wherein a capacitor insulating film is formed between said substrate and said first semiconductor film to produce a capacitor device.

* * * * *